(12) United States Patent
Yan et al.

(10) Patent No.: US 12,242,690 B2
(45) Date of Patent: Mar. 4, 2025

(54) PANEL, MOTHERBOARD, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jun Yan, Beijing (CN); Xiangdan Dong, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/022,983

(22) PCT Filed: Apr. 24, 2022

(86) PCT No.: PCT/CN2022/088831
§ 371 (c)(1),
(2) Date: Feb. 23, 2023

(87) PCT Pub. No.: WO2023/205963
PCT Pub. Date: Nov. 2, 2023

(65) Prior Publication Data
US 2024/0272741 A1  Aug. 15, 2024

(51) Int. Cl.
*G06F 3/041* (2006.01)
*H10K 59/131* (2023.01)
(Continued)

(52) U.S. Cl.
CPC ....... *G06F 3/04164* (2019.05); *H10K 59/131* (2023.02); *H10K 59/40* (2023.02); *H10K 59/88* (2023.02); *H10K 77/111* (2023.02); *G06F 2203/04102* (2013.01); *H10K 2102/311* (2023.02)

(58) Field of Classification Search
CPC ...... G06F 3/04164; G06F 2203/04102; H10K 59/131; H10K 59/40; H10K 59/88; H10K 77/111; H10K 2102/311
See application file for complete search history.

(56) References Cited

U.S. PATENT DOCUMENTS

| 12,039,936 B2 * | 7/2024 | Kang | G09G 3/3233 |
| 2006/0028414 A1 * | 2/2006 | Kimura | G09G 3/006 |
| | | | 345/87 |

(Continued)

*Primary Examiner* — Amy Onyekaba
(74) *Attorney, Agent, or Firm* — IPro, PLLC

(57) ABSTRACT

The disclosure provides a panel, a motherboard, and a display device. The panel has an active area and an inactive area surrounding the active area. The panel includes: a plurality of groups of signal lines positioned in the active area; a plurality of groups of bonding pins distributed in portions, on two opposite sides of the active area, of the inactive area, different groups of bonding pins on the same side of the active area being arranged in a row; and a plurality of groups of trace lines distributed in the inactive area surrounding the active area, one end of the trace line being electrically connected with the signal line, the other end of the trace line being electrically connected with the bonding pin, and two ends of the same signal line being electrically connected with two trace lines.

18 Claims, 19 Drawing Sheets

(51) Int. Cl.
  *H10K 59/40*   (2023.01)
  *H10K 59/88*   (2023.01)
  *H10K 77/10*   (2023.01)
  *H10K 102/00*   (2023.01)

(56) References Cited

U.S. PATENT DOCUMENTS

| | | | |
|---|---|---|---|
| 2009/0310051 A1* | 12/2009 | Kim | G02F 1/136204 |
| | | | 349/40 |
| 2010/0309421 A1* | 12/2010 | Gotoh | G02F 1/1368 |
| | | | 349/152 |
| 2017/0371447 A1* | 12/2017 | Fukushima | G06F 3/0446 |
| 2018/0210577 A1* | 7/2018 | Chan | G06F 3/04164 |
| 2020/0119124 A1* | 4/2020 | Ahn | H10K 77/111 |
| 2020/0125314 A1* | 4/2020 | Cho | G06F 3/1431 |
| 2021/0109639 A1* | 4/2021 | Hsieh | G06F 3/0412 |
| 2021/0248938 A1* | 8/2021 | Lee | G09G 3/006 |
| 2021/0249500 A1* | 8/2021 | Lee | G09G 3/3233 |
| 2022/0013048 A1* | 1/2022 | Kim | G09G 3/20 |

\* cited by examiner

PANEL, MOTHERBOARD, AND DISPLAY DEVICE

CROSS REFERENCE TO RELATED APPLICATIONS

This application is a national phase entry under 35 U.S.C. § 371 of International Application No. PCT/CN2022/088831, filed on Apr. 24, 2022, the entire content of which is incorporated herein by reference.

FIELD

The disclosure relates to the technical field of active matrix organic light emitting diode, and in particular to a panel, a motherboard, and a display device.

BACKGROUND

In the field of active matrix organic light emitting diodes (AMOLED), flexible multi-layer on cell (FMLOC) is generally used to realize full-screen, borderless, thin, and light-weight AMOLEDs.

The conventional FMLOC touch design adopts the down-out scheme, that is, the touch signal is provided through the flexible printed circuit (FPC) under the screen, but for large-size FMLOC, as the display panel border decreases, the trace space for peripheral signal line (also known as the trace signal line) is compressed, and the line width of the trace signal line is further compressed, resulting in an increase in the resistance of the trace signal line. As a result, the frequency of the large-size FMLOC touch drive decreases, and the sensitivity, SNR, and reporting rate are affected.

SUMMARY

The disclosure provides a panel, a motherboard, and a display device, to solve the above technical problems in the prior art.

In a first aspect, in order to solve the above technical problems, an embodiment of the disclosure provides a panel. The panel includes an active area and an inactive area surrounding the active area. The panel includes: a plurality of groups of signal lines positioned in the active area; a plurality of groups of bonding pins distributed in portions, on two opposite sides of the active area, of the inactive area, different groups of bonding pins on the same side of the active area being arranged in a row; and a plurality of groups of trace lines distributed in the inactive area surrounding the active area, one end of the trace line being electrically connected with the signal line, the other end of the trace line being electrically connected with the bonding pin, and two ends of the same signal line being electrically connected with two trace lines.

In some embodiments, the plurality of groups of signal lines include: two groups of first signal sub-lines extending in a first direction, the two groups of first signal sub-lines being symmetrically distributed with respect to a first central line passing through a center of the active area, and an extension direction of the first central line being the first direction. The plurality of groups of trace lines include: four groups of first sub-trace lines, every two groups of first sub-trace lines being electrically connected with one group of first signal sub-lines, two groups of first sub-trace lines connected with the same group of first signal sub-lines being symmetrical with respect to a second central line passing through the center of the active area, two groups of first sub-trace lines connected with different groups of first signal sub-lines being symmetrical with respect to the first central line, an extension direction of the second central line being a second direction, and the second direction intersecting the first direction.

In some embodiments, the plurality of groups of signal lines include: two groups of second signal sub-lines extending in a second direction, the two groups of second signal sub-lines being symmetrically distributed with respect to a second central line passing through the center of the active area, and an extension direction of the second central line being the second direction. The plurality of groups of trace lines include: four groups of second sub-trace lines, every two groups of second sub-trace lines being electrically connected with one group of second signal sub-lines, two groups of second sub-trace lines connected with the same group of second signal sub-lines being symmetrical with respect to a first central line passing through the center of the active area, two groups of second sub-trace lines connected with different groups of second signal sub-lines being symmetrical with respect to the second central line, and an extension direction of the first central line intersecting the second direction.

In some embodiments, the panel has a bending area positioned between the bonding pin and the active area, and the other end of the trace line is electrically connected with the corresponding bonding pin passing through the bending area. The panel further includes: a plurality of electrical testing signal lines electrically connected one-to-one to the bonding pins, the electrical testing signal line being electrically connected with an electrical testing pin, the electrical testing pin being used for performing flexible multi-layer on cell electrical test (FMLOC ET) on the signal line of the panel being in a non-modular state, and the non-modular state being a state before the panel is not bound with a flexible circuit board provided with a driving circuit.

In some embodiments, the electrical testing signal line is electrically connected with one end, away from the bending area, of the bonding pin.

In some embodiments, the electrical testing signal line is electrically connected with a corresponding bonding pin through a corresponding trace line.

In some embodiments, the electrical testing signal line is electrically connected with the trace line in a region between the bending area and the bonding pin. Alternatively, the electrical testing signal line is electrically connected with the trace line in a region between the active area and the bending area.

In some embodiments, one ends of the plurality of electrical testing signal lines away from the bonding pins extend to an edge of the inactive area and are sectioned.

In some embodiments, the panel further includes: at least two groups of the electrical testing pins arranged side by side with corresponding groups of bonding pins. Each electrical testing pin is electrically connected with one bonding pin through one electrical testing signal line, and one end, close to the active area, of the electrical testing pin is electrically connected with the electrical testing signal line.

In some embodiments, the electrical testing signal line includes a backboard metal line.

In some embodiments, the electrical testing signal line is double layered.

In some embodiments, the panel is a display panel, the first signal sub-line is a scanning line, and the second signal sub-line is a data line. Alternatively, the panel is a touch panel, the first signal sub-line is a touch sensing line, and the second signal sub-line is a touch driving line.

In a second aspect, an embodiment of the disclosure provides a motherboard. The motherboard includes: a plurality of panel cells arranged in an array, the panel cell including the panel as in the first aspect, the panel cell being provided with an active area and a frame area surrounding the active area, the frame area including a trace area surrounding the active area and flexible structure areas extending from portions, on two opposite sides of the active area, of the trace area, respectively, and the trace area and the flexible structure areas jointly forming an inactive area of the panel; a first cutting line for cutting the panel cell at an outer boundary of the frame area; and a second cutting line for cutting to form the panel at an outer boundary of the inactive area, and the second cutting line being used after the panel cell undergoes an electrical test.

In some embodiments, the panel cell further includes: at least two groups of electrical testing pins on one side, facing away from the flexible structure area, of the second cutting line or in the flexible structure area, and arranged in a same row with corresponding groups of bonding pins in the panel, each electrical testing pin being electrically connected with one bonding pin through one electrical testing signal line in a region between an outer boundary line of the frame area and an outer boundary line of the trace area, and one end, close to the active area, of the electrical testing pin being electrically connected with the electrical testing signal line.

In a third aspect, an embodiment of the disclosure provides a display device. The display device includes: the panel as in the first aspect, the panel being at least one of a display panel and a touch panel.

Figure 1:
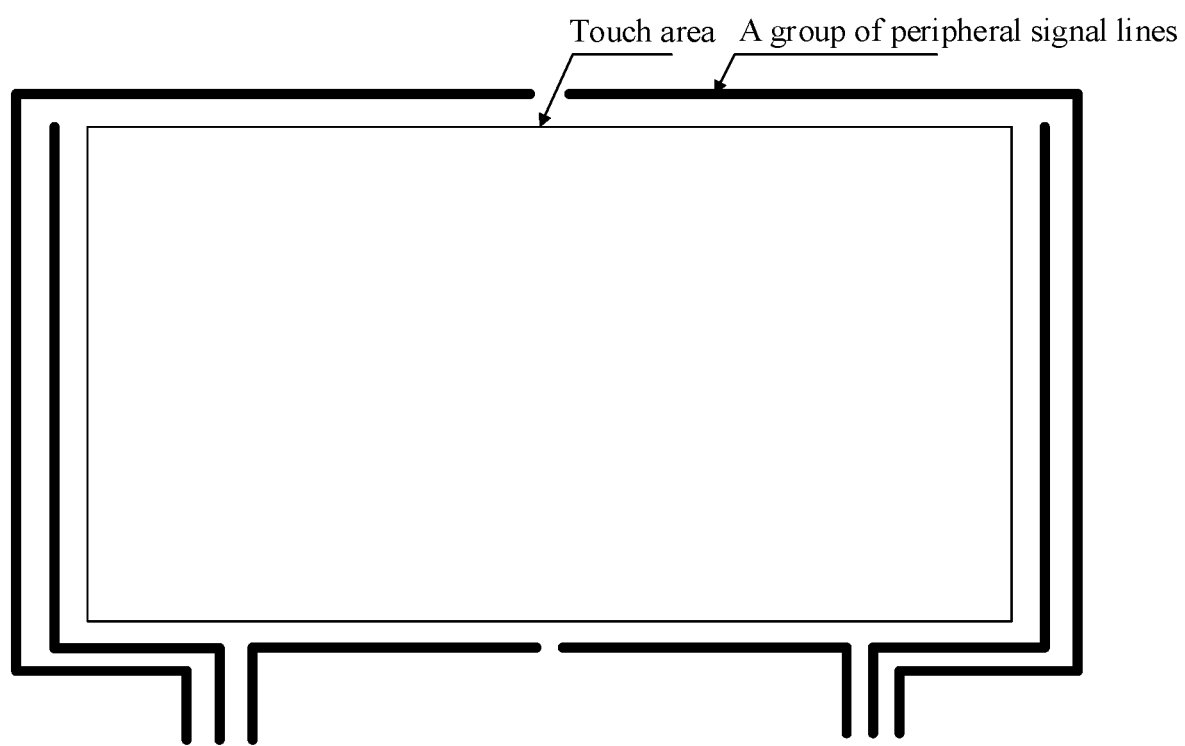
FIG. 1 is a schematic arrangement diagram of a peripheral signal line of a large-sized touch panel in the related art.

Bonding pin 1, trace line 2, signal line 3, first signal sub-line 31, second signal sub-line 32, first direction X, center O of active area, first central line M1, second direction Y, first sub-trace line 21, second central line M2, second sub-trace line 22, electrical testing signal line 4, electrical testing pin 5, first touch electrode 61, second touch electrode 62, touch sub-electrode 621, bridging portion 622, and a plurality of panel cells 100.

DETAILED DESCRIPTION

Embodiments of the disclosure provide a panel, a motherboard, and a display device, to solve the problem of high resistance of a peripheral signal line.

In order to make the above objectives, features, and advantages of the disclosure clearer and more understandable, the disclosure will be further described in detail below in conjunction with the accompanying drawings and the embodiments. However, the illustrative implementation modes can be embodied in various forms and should not be interpreted as being limited to the implementation modes set forth herein. Rather, upon provision of these implementation modes, the disclosure is more thorough and complete, and will fully convey the concept of the illustrative implementation modes to those skilled in the art. The same reference numerals in the accompanying drawings denote the identical or similar structures, the repetitions of which will not be repeated herein. The words expressing positions and directions described in the disclosure are all illustrated by way of example in the accompanying drawings, but can also be changed as required, and all the changes fall within the scope of protection of the disclosure. The accompanying drawings of the disclosure are merely for illustrating relative position relations and are not intended to represent true proportions.

It is to be noted that specific details are set forth in the following description to facilitate a thorough understanding of the disclosure. However, the disclosure can be implemented in many other ways than those described herein, and those skilled in the art can make similar extensions without departing from the intension of the disclosure. The disclosure is therefore not to be limited by the specific implementation modes disclosed below. Hereafter, the description describes preferred implementation modes for implementing the disclosure, and the description is intended to illustrate the general principles of the disclosure instead of limiting the scope of the disclosure. The scope of protection of the disclosure should be defined by the appended claims.

With reference to FIG. 1, a schematic arrangement diagram of a peripheral signal line of a large-sized touch panel in the related art is shown.

As shown in FIG. 1, a touch sensing line (not shown in the figure) and a touch driving line (not shown in the figure) of the large size touch panel employ double-side driving, and peripheral signal lines at two sides led out from the touch sensing line and the touch driving line are gathered to a portion under a touch area of a large size display panel and electrically connected with corresponding bonding pins (not shown in the figure), respectively.

It can be seen from FIG. 1 that when a frame of the touch panel is reduced, a wiring space of the peripheral signal line is narrowed. Accordingly, a width of the peripheral signal line is required to be reduced in order to allow the peripheral signal lines to be arranged as many as before, which will lead to an increase in resistance of the peripheral signal line, and a degradation of touch performance of the large-sized touch panel.

It is to be understood that for ease of illustration, a group of lead-out lines are shown as thick solid lines in FIG. 1.

In order to solve the above problems, the disclosure provides the following technical solutions.

Figure 2:
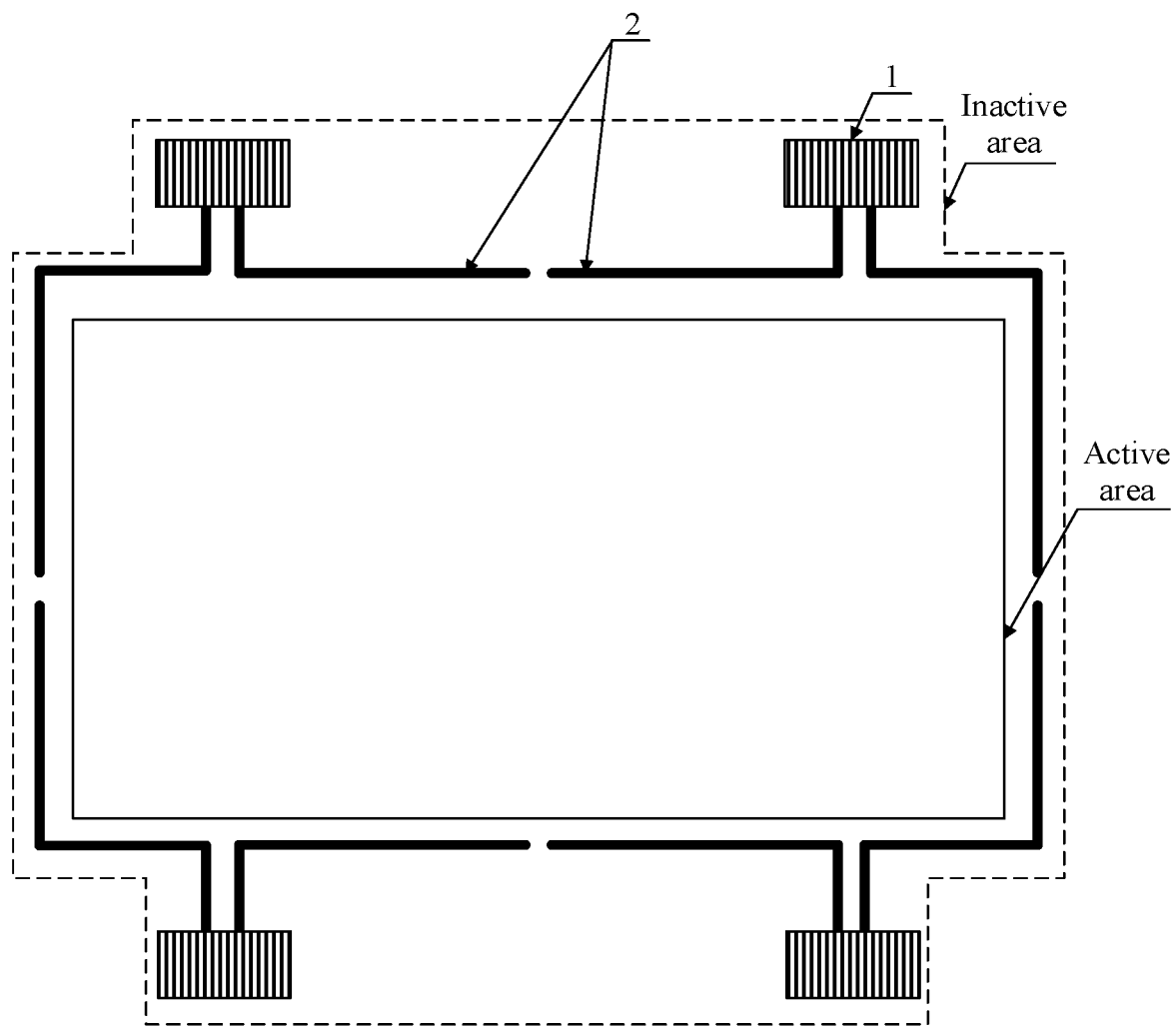
FIG. 2 is a schematic structural diagram of a panel according to an embodiment of the disclosure.

With reference to FIG. 2, a schematic structural diagram of a panel according to an embodiment of the disclosure is shown. The panel includes an active area and an inactive area surrounding the active area (that is, a region between an outer boundary of the active area and a dashed frame). The panel includes:

- a plurality of groups of signal lines 3 (not shown) in the active area;
- a plurality of groups of bonding pins 1 distributed in portions, on two opposite sides of the active area, of the inactive area, different groups of bonding pins 1 on the same side of the active area being arranged in a row. FIG. 2 shows four groups of bonding pins 1 rather than a single bonding pin 1. Each group of bonding pins 1 includes a plurality of bonding pins 1. In FIG. 2, two groups of bonding pins 1 above the active area are arranged in a row, and two groups of bonding pins 1 below the active area are arranged in a row, for example; and
- a plurality of groups of trace lines 2 distributed in the inactive area surrounding the active area, one end of the trace line 2 being electrically connected with the signal line 3, the other end of the trace line 2 being electrically connected with the bonding pin 1, and two ends of the same signal line 3 being electrically connected with two trace lines 2, respectively.

If the panel is a touch panel, the signal line 3 includes a touch sensing line and a touch driving line, and the active area is a touch area of the touch panel. If the panel is a display panel, the signal line 3 includes a data line and a scanning line, and the active area is a display area of the display panel.

In the embodiment provided by the disclosure, by distributing the plurality of groups of bonding pins 1 on the two opposite sides of the active area, and arranging different groups of bonding pins 1 on the same side of the active area in a row, the plurality of groups of trace lines 2 distributed around the active area may be grouped and connected with the bonding pins 1 on the two opposite sides of the active area. Therefore, the trace line 2 may be connected with the nearest bonding pin 1, so as to reduce a length of the trace line 2, thereby reducing both the resistance of the trace line 2 and distances between two sides, without the bonding pins 1, of the inactive area and two corresponding sides of the active area, facilitating the design of a narrow-bezel panel.

Figure 3:
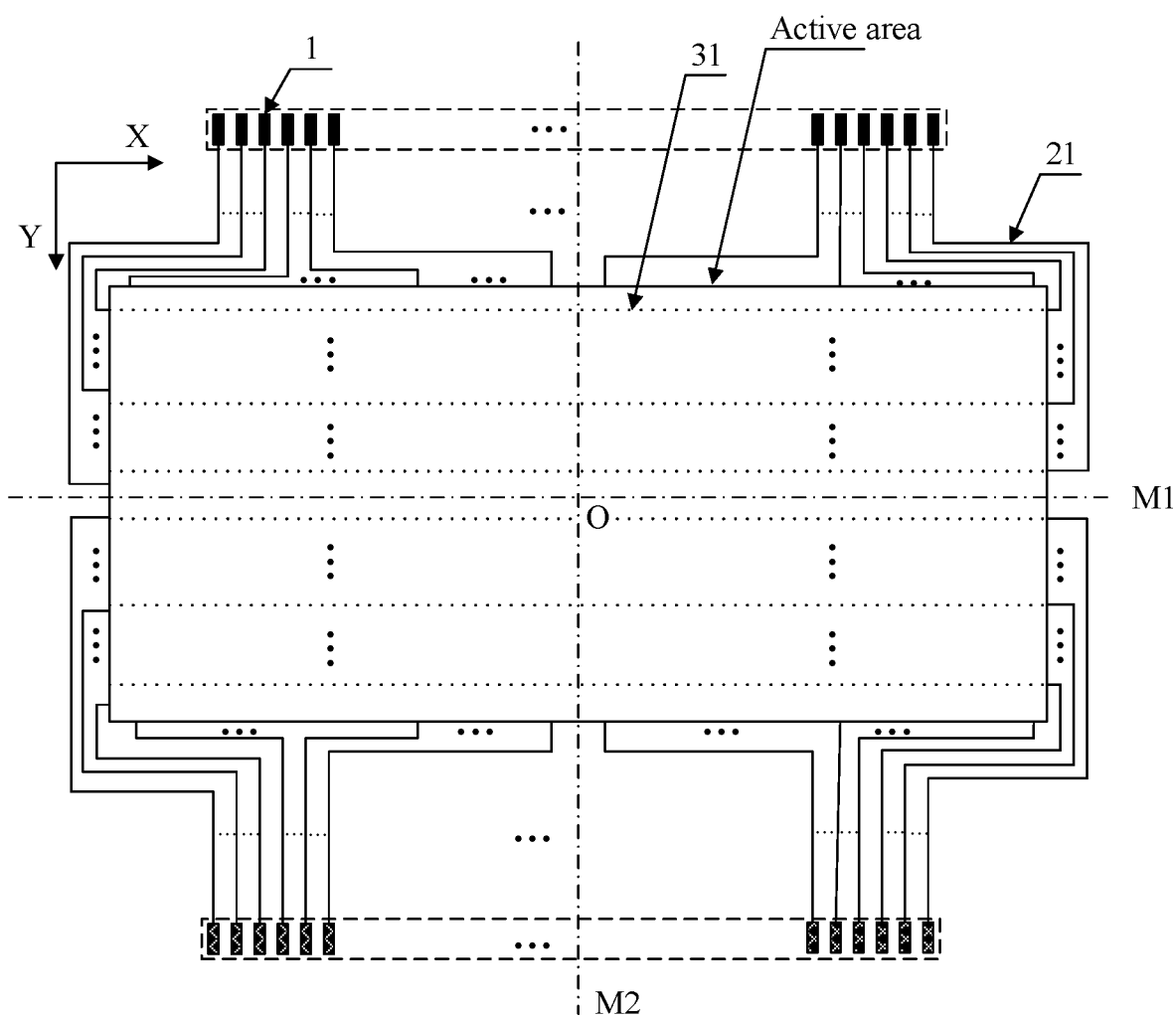
FIG. 3 is a schematic structural diagram of another panel according to an embodiment of the disclosure.

With reference to FIG. 3, a schematic structural diagram of another panel according to an embodiment of the disclosure is shown. In the panel, a plurality of groups of signal lines 3 include:

- two groups of first signal sub-lines 31 extending in a first direction X, the two groups of first signal sub-lines 31 being symmetrically distributed with respect to a first central line M1 passing through a center O of the active area, and an extension direction of the first central line M1 being the first direction X.

A plurality of groups of trace lines 2 include: four groups of first sub-trace lines 21, every two groups of first sub-trace lines 21 being electrically connected with one group of first signal sub-lines 31, two groups of first sub-trace lines 21 connected with the same group of first signal sub-lines 31 being symmetrical with respect to a second central line M2 passing through the center O of the active area, two groups of first sub-trace lines 21 connected with different groups of first signal sub-lines 31 being symmetrical with respect to the first central line M1, an extension direction of the second central line M2 being a second direction Y, and the second direction Y intersecting the first direction X.

For example, when the panel is a display panel, the first signal sub-line 31 is a scanning line, and the first sub-trace line 21 is a lead of the scanning line. The scanning lines of the display panel are divided into two groups, and two ends of each scanning line are each connected with one corresponding lead. Leads of two groups of scanning lines led out from the same side of different groups of scanning lines are connected with two groups of bonding pins 1 on two opposite sides of the active area along a periphery of the active area, respectively. Compared with the related art (as shown in FIG. 1), the number of the first signal sub-lines 31 connected with the same group of bonding pins 1, a wiring length of the trace line of some of the first signal sub-lines 31, and an area, occupied by the trace lines of the first signal sub-lines 31, of an inactive area may all be reduced.

For another example, when the panel is a touch panel, the first signal sub-line 31 is a touch sensing line, and the first sub-trace line 21 is a lead of the touch sensing line. The touch sensing lines of the display panel are divided into two groups. Two ends of each touch sensing line are each connected with one corresponding lead. Leads of two groups of touch sensing lines led out from the same side of different groups of touch sensing lines are connected with two groups of bonding pins 1 on two opposite sides of the active area along a periphery of the active area, respectively. Therefore, a wiring length of the trace line of some of the first signal sub-lines 31, and an area, occupied by the trace lines of the first signal sub-lines 31, of an inactive area may also be reduced.

In the embodiment provided by the disclosure, the first sub-trace lines 21 extending in the first direction X are divided into two groups and connected with different groups of bonding pins 1 symmetrically arranged with respect to the active area, respectively. Therefore, both the number of the first sub-trace lines 21 led out from the same side of the first signal sub-lines 31 and connected with the same group of bonding pins 1, and a length of the trace line of some of the first signal sub-lines 31 may be reduced, so that the first sub-trace line 21 occupies a small space of the inactive area when being arranged along the periphery of the active area. In this way, a width of the first sub-trace line 21 is not required to be reduced, and the resistance of the first sub-trace line 21 will not be increased. Since the length of some of the first sub-trace lines 21 is reduced, the resistance of some of the first sub-trace lines 21 may be reduced, and finally the resistance of the first sub-trace line 21 is reduced while the inactive area of the panel is reduced. Thus, the narrow bezel design of the panel may be realized while a driving frequency may be improved, so that the sensitivity, the signal to noise ratio, etc. may be improved.

Figure 4:
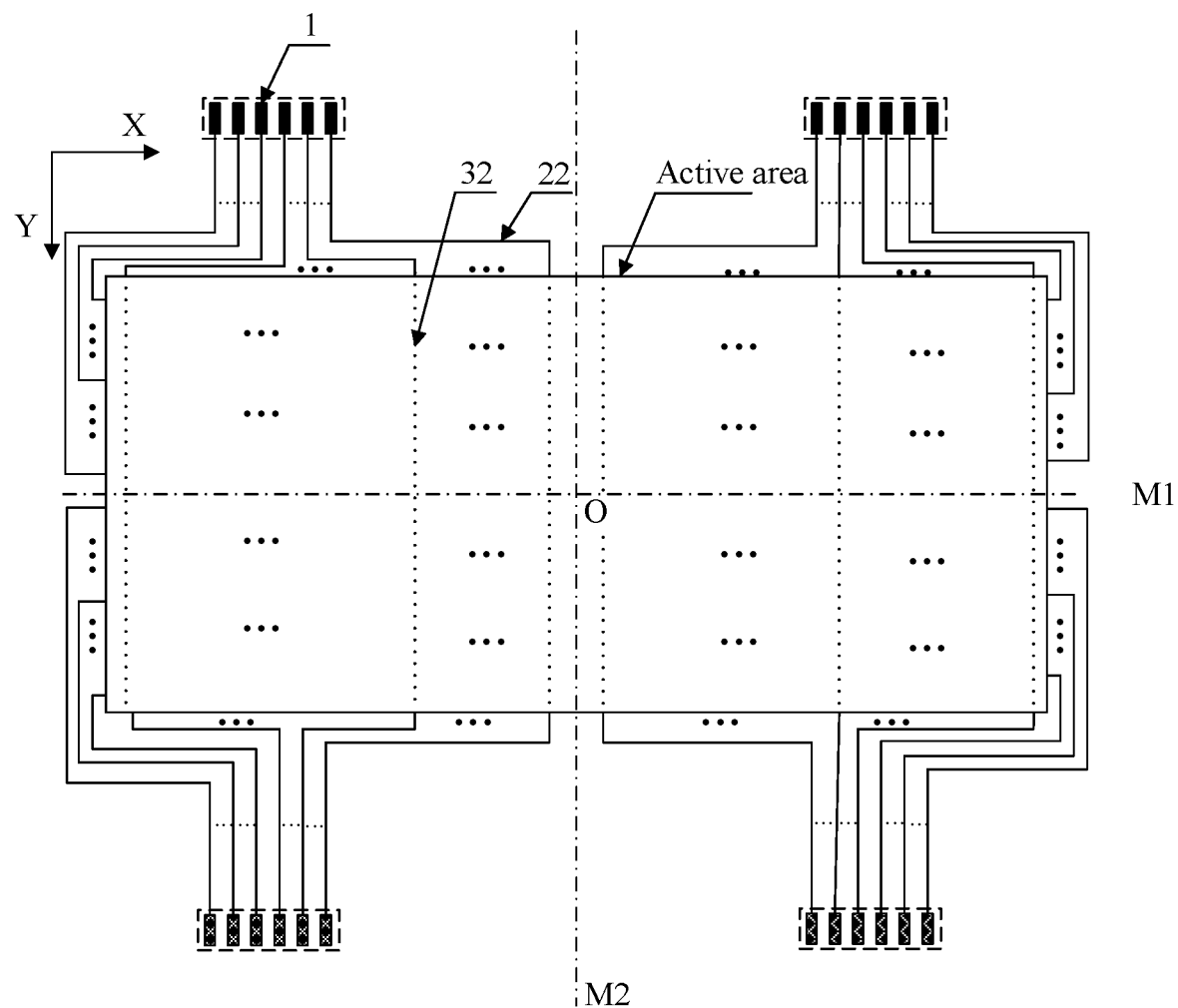
FIGS. 4 and 5 are schematic structural diagrams of yet another panel according to an embodiment of the disclosure.
Figure 5:
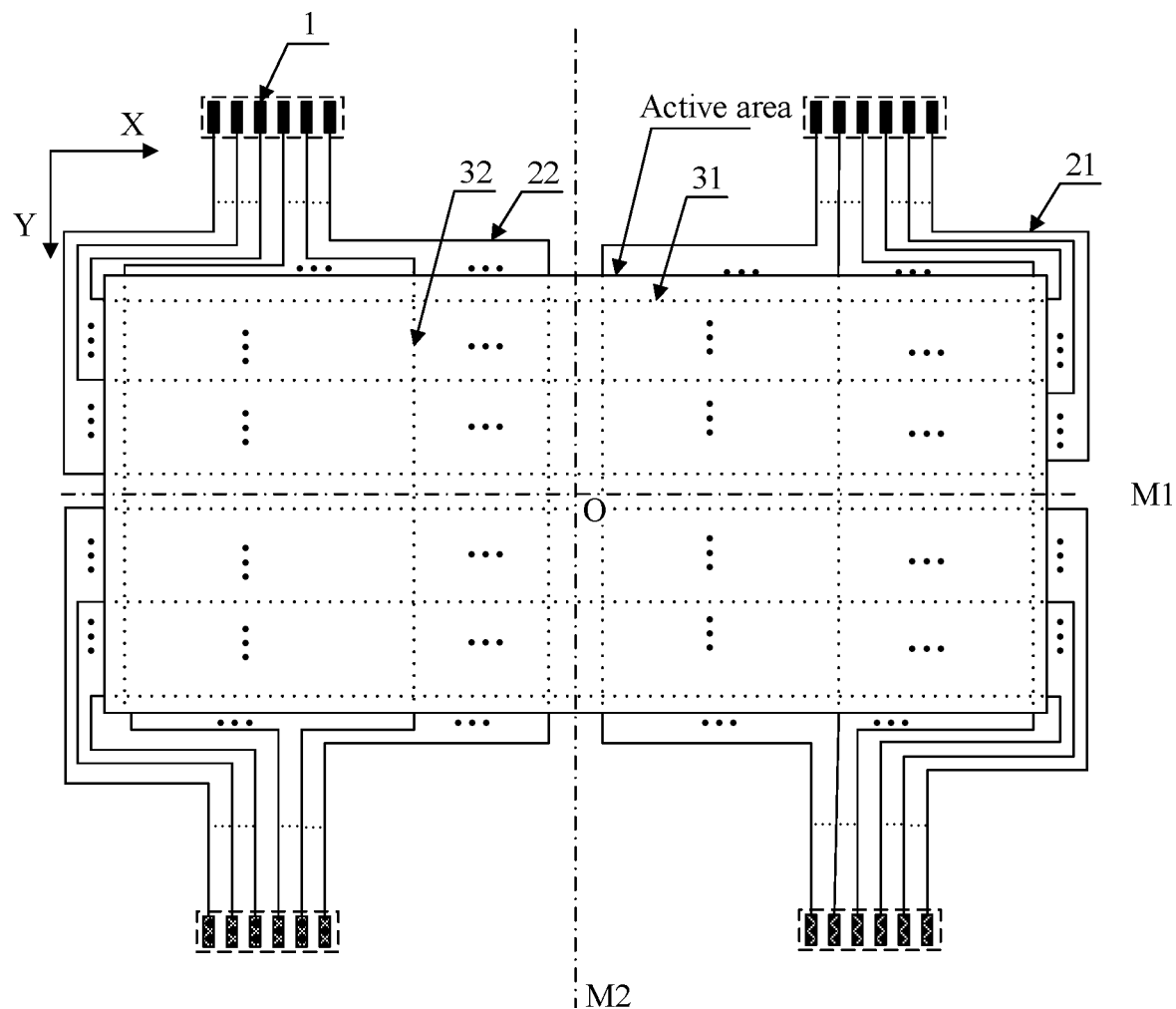

With reference to FIGS. 4 and 5, schematic structural diagrams of yet another panel according to an embodiment of the disclosure are shown. In the panel, a plurality of groups of signal lines 3 include:

- two groups of second signal sub-lines 32 extending in a second direction Y, the two groups of second signal sub-lines 32 being symmetrically distributed with respect to a second central line M2 passing through a center O of an active area, and an extension direction of the second central line M2 being the second direction Y.

A plurality of groups of trace lines 2 include:
four groups of second sub-trace lines 22, every two groups of second sub-trace lines 22 being electrically connected with one group of second signal sub-lines 32, two groups of second sub-trace lines 22 connected with the same group of second signal sub-lines 32 being symmetrical with respect to the first central line M1 passing through the center O of the active area, two groups of second sub-trace lines 22 connected with different groups of second signal sub-lines 32 being symmetrical with respect to the second central line M2, and an extension direction of the first central line M1 intersecting the second direction Y.

For example, when the panel is a display panel, the second signal sub-line 32 is a data line, and the second sub-trace line 22 is a lead of the data line. The data lines of the display panel are divided into two groups, and two ends of each data line are each connected with one corresponding lead. Leads of two groups of data lines led out from the same side of different groups of data lines are connected with two groups of bonding pins 1 on two opposite sides of the active area along a periphery of the active area, respectively. Compared with the related art (as shown in FIG. 1), the number of the second signal sub-lines 32 connected with the same group of bonding pins 1, a wiring length of the trace line of some of the first signal sub-lines 32, and an area, occupied by the trace lines of the second signal sub-lines 32, of an inactive area may all be reduced.

For another example, when the panel is a touch panel, the first signal sub-line 31 is a touch driving line, and the first sub-trace line 21 is a lead of the touch driving line. The touch driving lines of the display panel are divided into two groups. Two ends of each touch driving line are each connected with one corresponding lead. Leads of two groups of touch driving lines led out from the same side of different groups of touch driving lines are connected with two groups of bonding pins 1 on two opposite sides of the active area along a periphery of the active area, respectively. Therefore, a wiring length of the trace line of some of the first signal sub-lines 31, and an area, occupied by the trace lines of the first signal sub-lines 31, of an inactive area may also be reduced.

As shown in FIG. 5, both the first signal sub-lines 31 and the second signal sub-lines 32 may be divided into two groups, respectively, and the arrangement of the first corresponding sub-trace lines 21 and the second corresponding sub-trace lines 22 is similar to the mode described above, which will not be repeated herein. In this way, in a larger-sized panel, a length of a trace line 2 and an area, occupied by the trace line, of an inactive area may be reduced.

In the embodiment provided by the disclosure, the second sub-trace lines 22 extending in the second direction Y are divided into two groups and connected with different groups of bonding pins 1 symmetrically arranged with respect to the active area, respectively. Therefore, both the number of the second sub-trace lines 22 led out from the same side of the second signal sub-line 32 and connected with the same group of bonding pins 1, and the length of the trace line of some of the second signal sub-lines 32 may be reduced, so that the second sub-trace line 22 occupies a small space of the inactive area when being arranged along the periphery of the active area. In this way, a width of the second sub-trace line 22 is not required to be reduced, and the resistance of the second trace line 2 will not be increased. Since the length of some of the second sub-trace lines 22 is reduced, the resistance of some of the second sub-trace lines 22 may be reduced, and finally, the resistance of the second sub-trace line 22 is reduced while the inactive area of the panel is reduced. Thus, the narrow frame design of the panel may be realized while a driving frequency may be improved, so that the sensitivity, the signal to noise ratio, etc. may be improved.

Figure 6:
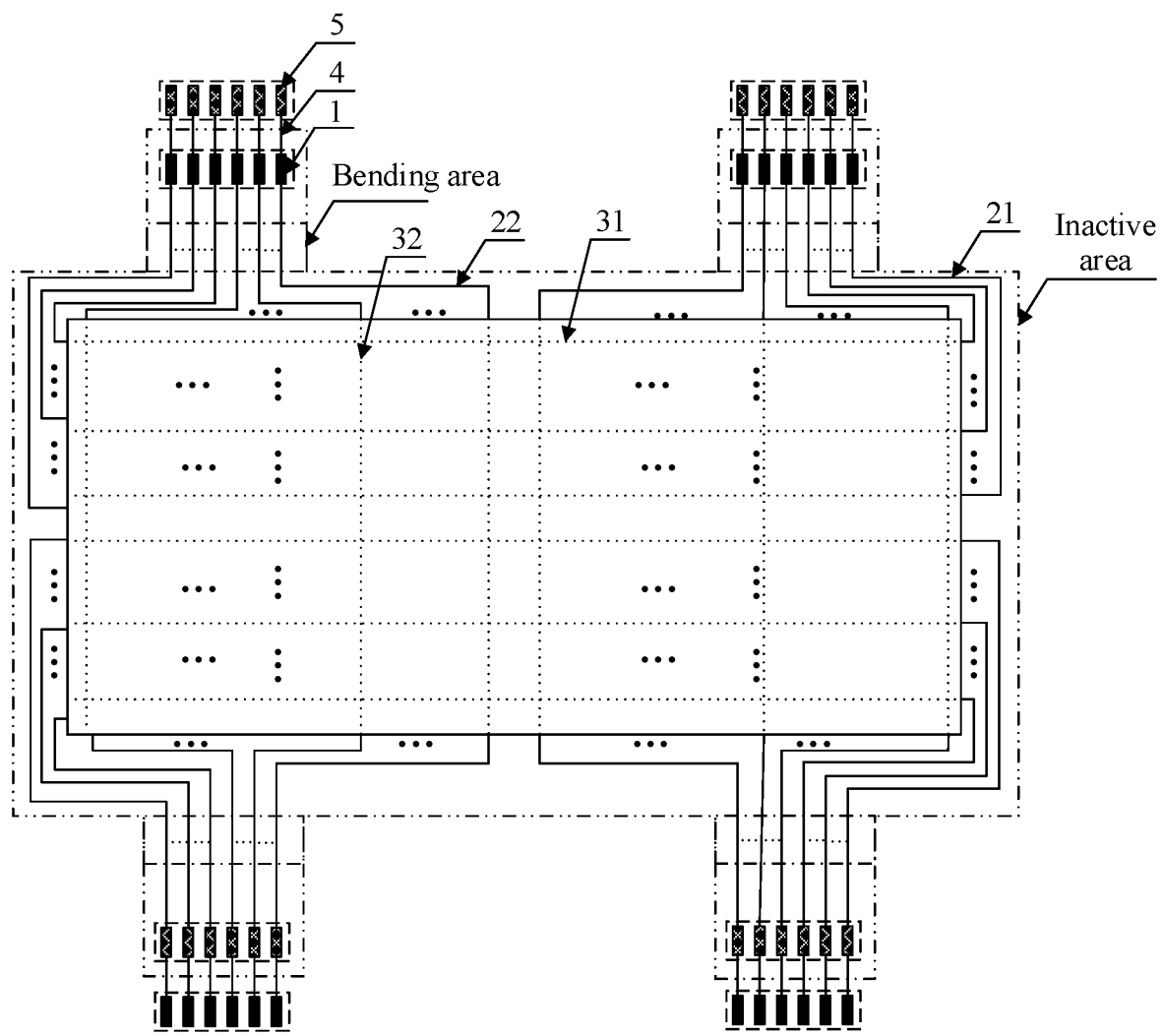
FIG. 6 is a schematic structural diagram of yet another panel according to an embodiment of the disclosure.

With reference to FIG. 6, a schematic structural diagram of yet another panel according to an embodiment of the disclosure is shown. The panel is provided with a bending area between bonding pins 1 and an active area, the other end of a trace line 2 passing through the bending area to be electrically connected with a corresponding bonding pin 1.

The panel further includes:
a plurality of electrical testing signal lines 4 electrically connected one-to-one with the bonding pins 1, the electrical testing signal line 4 being electrically connected with an electrical testing pin 5, the electrical testing pin 5 being used for a flexible multi-layer on cell electrical test on a signal line 3 when the panel is in a non-modular state, and the non-modular state being a state before the panel is not bound with a flexible circuit board provided with a driving circuit.

By arranging the electrical testing signal lines 4 electrically connected with all the bonding pins 1 in the panel, the electrical testing pin 5 electrically connected with the electrical testing signal line 4 may be used for performing the flexible multi-layer on cell electrical test on the signal line 3 when the panel is in the non-modular state.

As shown in FIG. 6, the electrical testing signal line 4 is electrically connected with one end, away from the bending area, of the bonding pin 1. In FIG. 6, all the electrical testing pins 5 are shown for ease of understanding. In fact, when the panel is in a modular state, the electrical testing pins 5 in FIG. 6 have been cut away, leaving only the electrical testing signal lines 4 in a non-display area.

Figure 7:
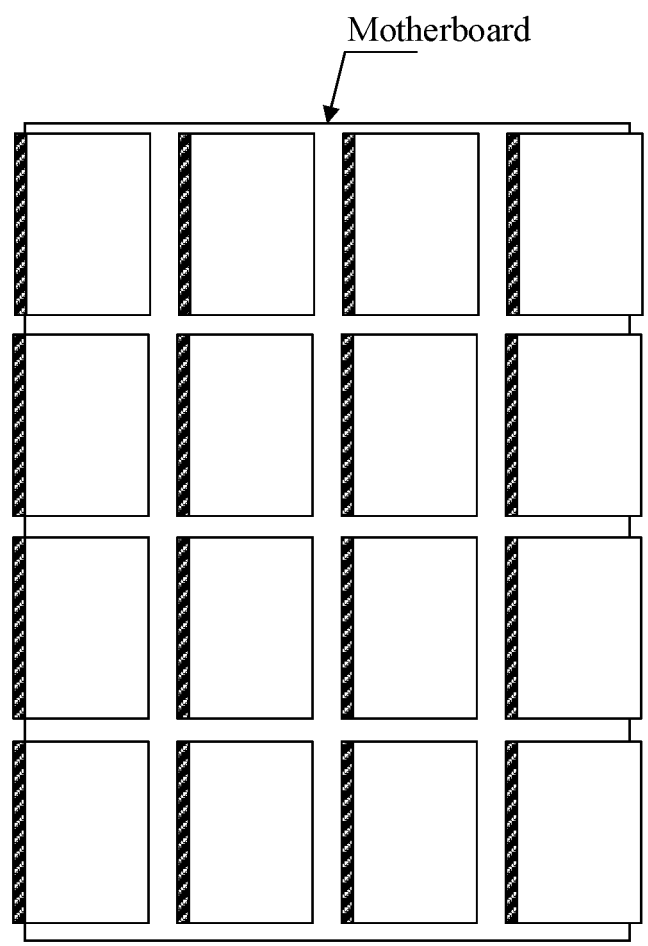
FIG. 7 is a schematic diagram showing the arrangement of panels in a motherboard according to an embodiment of the disclosure.

With reference to FIG. 7, a schematic arrangement diagram of a panel in a motherboard according to an embodiment of the disclosure is shown. As for the panel shown in FIG. 6, the trace lines 2 are led out from the two sides, so that this type of panel is required to occupy more space (more space shown as a black shaded area in FIG. 7) in the motherboard shown in FIG. 7 when in the non-modular state. Therefore, the number of panels in the non-modular state that may be arranged in the motherboard is reduced. In order to arrange more panels in the non-modular state in the motherboard, the electrical testing pin 5 and the bonding pin 1 are arranged side by side.

The electrical testing pin 5 described above may be retained or not after the flexible multi-layer on cell undergoes the electrical test. FIGS. 8-13 each shows a schematic diagram of the electrical connection between an electrical testing signal line and a bonding pin according to an embodiment of the disclosure. When the electrical testing pin is retained in the panel, the panel further includes:
at least two groups of electrical testing pins 5 arranged side by side with corresponding groups of bonding pins 1.

Each electrical testing pin 5 is electrically connected with one bonding pin 1 through one electrical testing signal line 4, one end, close to the active area, of the electrical testing pin 5 is electrically connected with the electrical testing signal line 4.

Figure 8:
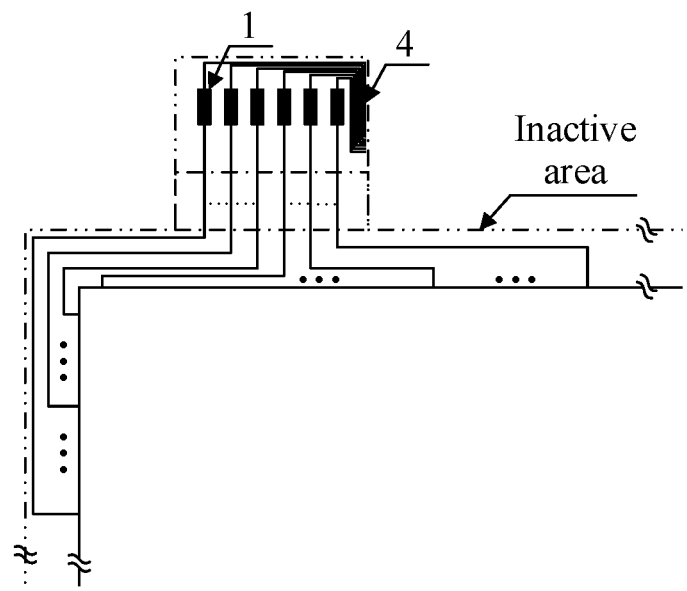
FIGS. 8-13 are schematic diagrams showing the electrical connection between an electrical testing signal line and a bonding pin according to an embodiment of the disclosure.
Figure 9:
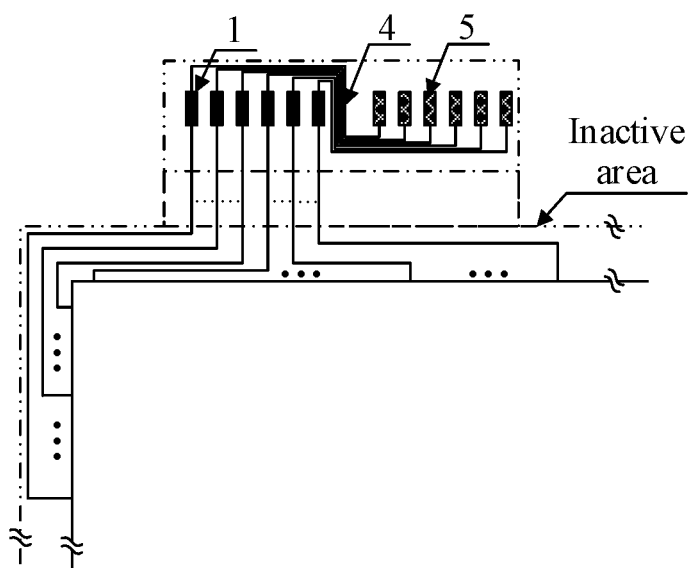

As shown in FIGS. 8 and 9, the electrical testing signal line 4 may be led out from one end, away from the bending area, of the bonding pin 1. If no electrical testing pin is retained in the panel, the electrical testing signal line 4 extends along a periphery of the whole group of bonding pins 1 and the bending area to an edge of an inactive area and is sectioned (as shown in FIG. 8). The section is formed by cutting away the electrical testing pin 5 after the flexible multi-layer on cell undergoes an electrical test. If electrical testing pins are retained in the panel, the electrical testing signal line 4 extends along a periphery of the whole group of bonding pins 1 and the bending area to one side, close to the bending area, of the electrical testing pin 5 (as shown in FIG. 9).

Figure 10:
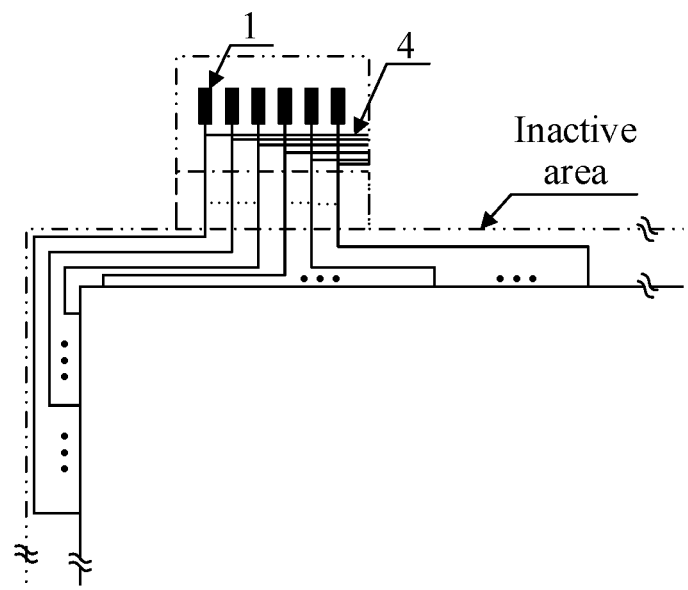
Figure 11:
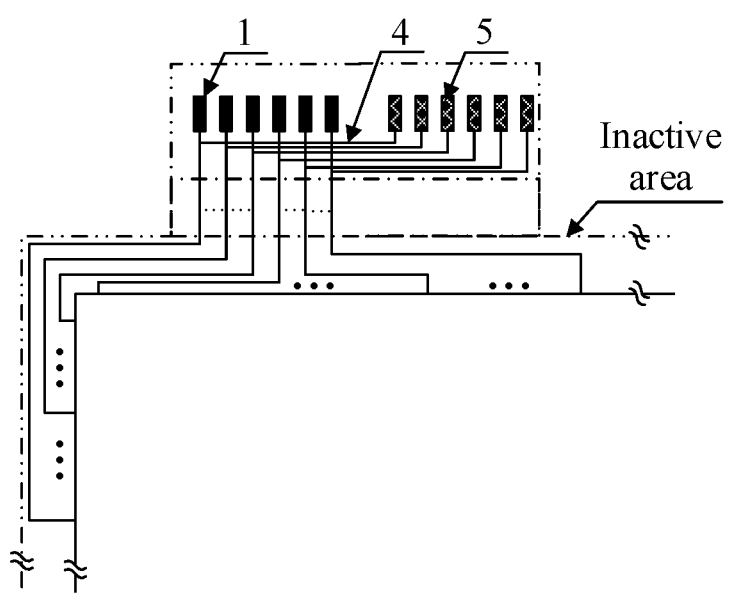
Figure 12:
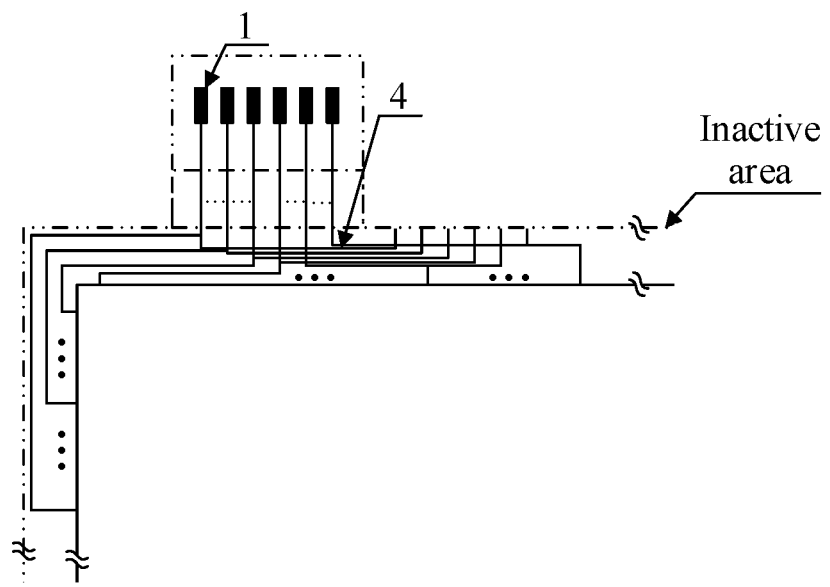
Figure 13:
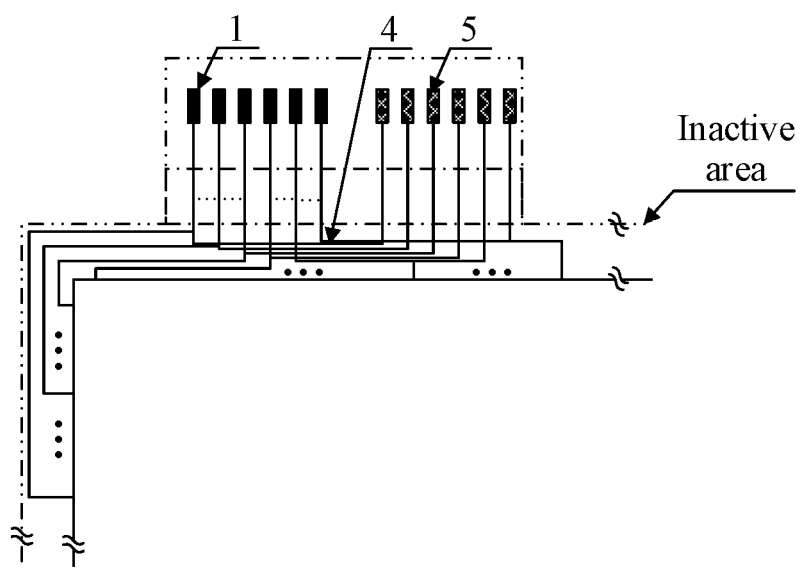

As shown in FIGS. 10-13, the electrical testing signal line 4 may also be electrically connected with a corresponding bonding pin 1 through a corresponding trace line 2. The electrical testing signal line 4 may be led out from a trace line 2 between the bonding pin 1 and the bending area (as shown in FIGS. 10 and 11), or from a trace line 2 between the bending area and the active area (as shown in FIGS. 12 and 13).

As shown in FIGS. 10 and 11, after the electrical testing signal line 4 is led out from the trace line 2 between the bonding pin 1 and the bending area, if the electrical testing pin 5 is not retained in the panel, the electrical testing signal line 4 extends along a periphery of the bending area to the edge of the inactive area and is sectioned (as shown in FIG. 10). If the electrical testing pin 5 is retained in the panel, the electrical testing signal line extends along a periphery of the bending area to one end, close to the bending area, of the electrical testing pin 5.

As shown in FIGS. 12 and 13, after the electrical testing signal line 4 is led out from the trace line 2 between the bending area and the active area, if the electrical testing pin 5 is not retained in the panel, the electrical testing signal line 4 extends along a periphery of the active area to the edge of the inactive area and is sectioned. If the electrical testing pin 5 is retained in the panel, the electrical testing signal line 4 extends along a periphery of the active area and passes through the bending area to the electrical testing pin 5.

The electrical testing signal line 4 includes a backboard metal line, such as a gate (metal Mo), a source/drain (SD) (Ti/Al/Ti), etc.

Figure 14:
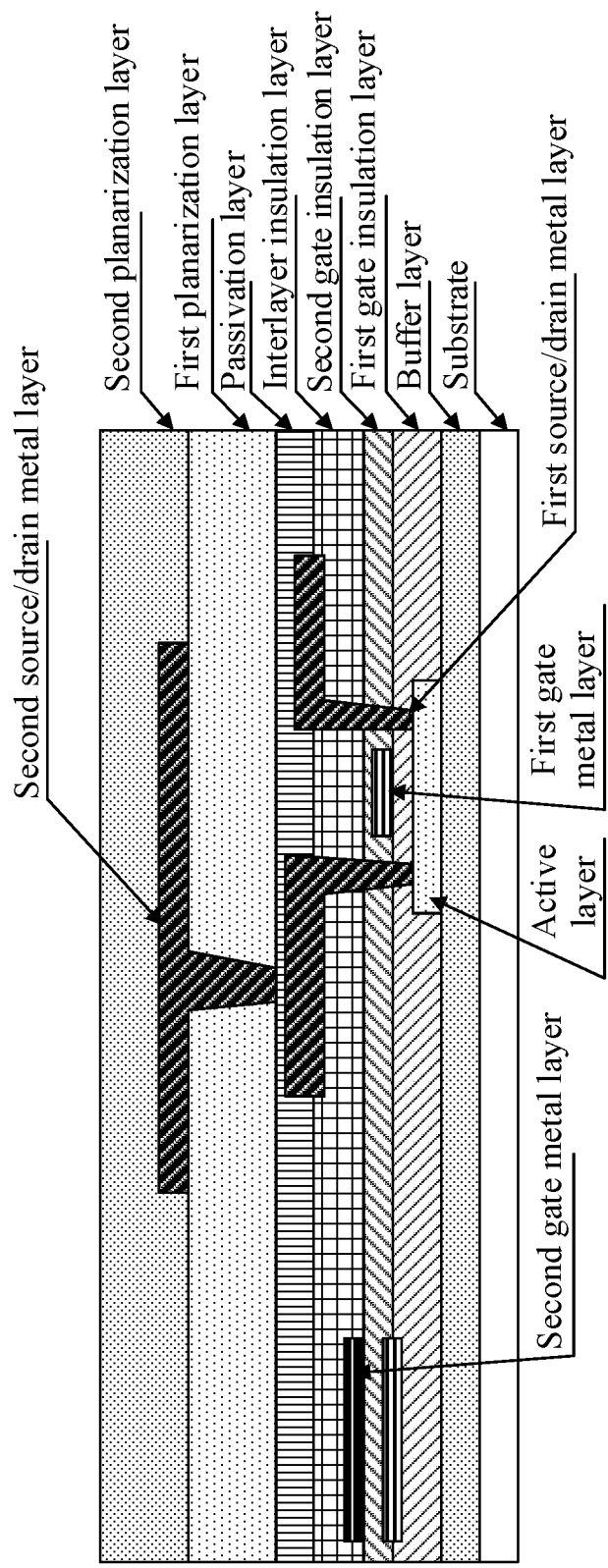
FIG. 14 is a schematic structural diagram of a backboard according to an embodiment of the disclosure.

With reference to FIG. 14, a schematic structural diagram of a backboard according to an embodiment of the disclosure is shown. The backboard includes a substrate, a buffer layer (Buffer), an active layer (P—Si), a first gate insulation layer (GI1), a first gate metal layer (Gate1), a second gate insulation layer (GI2), a second gate metal layer (Gate2), an interlayer insulation layer (ILD), a first source/drain metal layer (SD1), a passivation layer (PVX), a first planarization layer (PLN1), a second source/drain metal layer (SD2), and a second planarization layer (PLN2). The electrical testing signal line 4 may be disposed on the same layer as the first gate metal layer (Gate1), the second gate metal layer (Gate2), the first source/drain metal layer (SD1), and the second source/drain metal layer (SD2) in the backboard, or at least two of these metal layers are used for forming the electrical testing signal line 4. When at least two different metal layers are used for forming the electrical testing signal line 4, different metal layers corresponding to the electrical testing signal line 4 are electrically connected through vias.

The electrical testing pin 5 may be formed by stacking at least two of the first gate metal layer (Gate1), the second gate metal layer (Gate2), the first source/drain metal layer (SD1), and the second source/drain metal layer (SD2). For example, a stacked structure is formed in the SD1 and the SD2 to form one electrical testing pin 5.

Figure 15:
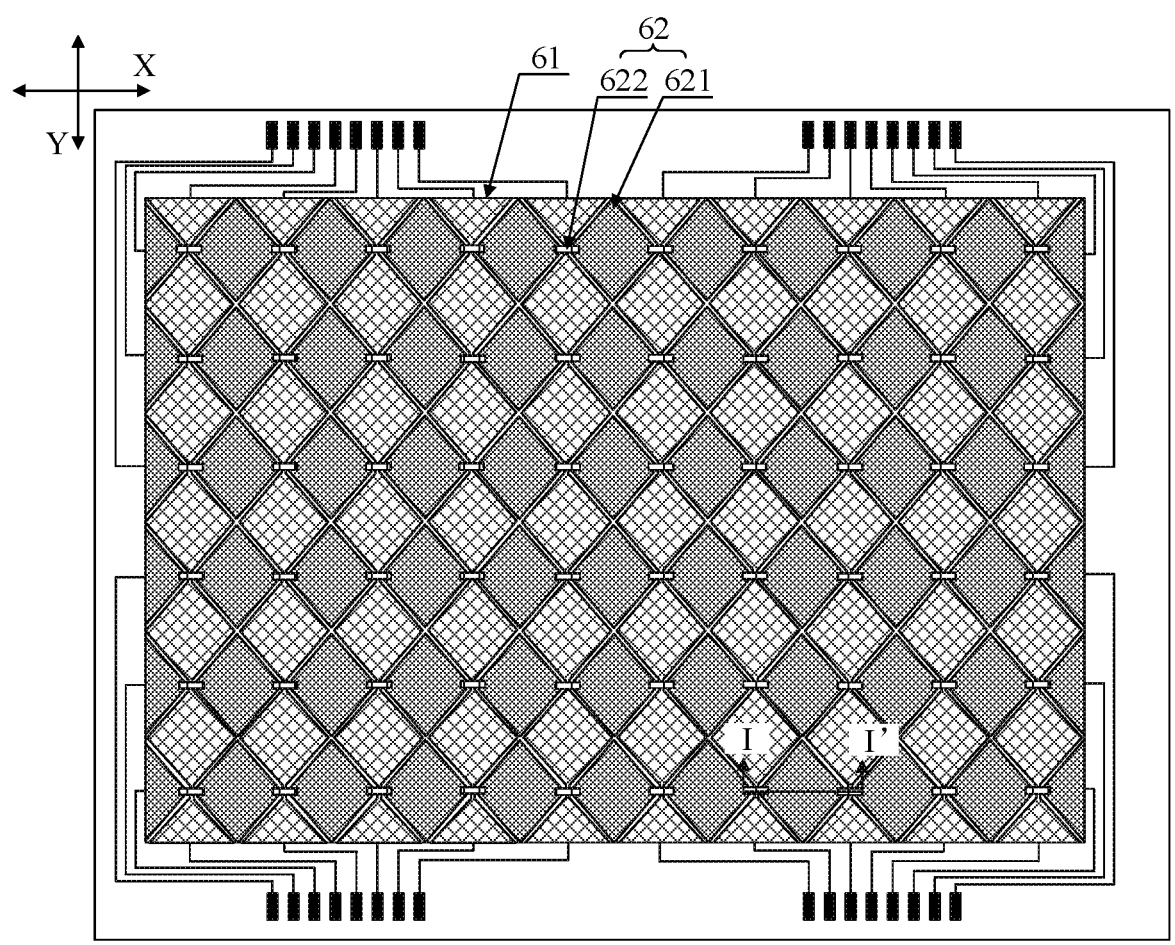
FIG. 15 shows a top view of a touch panel according to an embodiment of the disclosure.

With reference to FIG. 15, a top view of a touch panel according to an embodiment of the disclosure is shown. The touch panel includes a plurality of first touch electrodes 61 and a plurality of second touch electrodes 62, both of which are located in a touch area (that is, an active area). The plurality of first touch electrodes 61 and the plurality of second touch electrodes 62 are disposed alternatively in a second direction Y and a first direction X and on the same layer. In some examples, the second direction Y is perpendicular to the first direction X.

In some embodiments, the second touch electrode 62 further includes a plurality of touch sub-electrodes 621 and bridging portions 622, and two touch sub-electrodes 621, adjacent to each other, in the direction X are electrically connected through the bridging portion 622. The plurality of first touch electrodes 61 and the plurality of touch sub-electrodes 621 are synchronously formed through a patterning process (for example, including exposure, development, etching, etc.), and have the same material on the same layer. Although the first touch electrode 61 and the touch sub-electrode 621 are disposed on the same layer, the first touch electrode 61 and the touch sub-electrode 621 are insulated from each other.

With reference to FIG. 15, the plurality of first touch electrodes 61 are divided into a plurality of columns in the second direction Y, a plurality of first touch electrodes 61 in the same column are coupled to one another, and the first touch electrodes 61 in columns, adjacent to each other, of the plurality of columns of first touch electrodes 61 are insulated from each other. For example, in the second direction Y, the plurality of first touch electrodes 61 in the same column are coupled to one another, and the plurality of first touch electrodes 61 in different columns are insulated from each other. For example, the first touch electrodes 61 in each column may be used as a first channel for a first touch signal.

The plurality of second touch electrodes 62 are divided into a plurality of rows in the first direction X, a plurality of second touch electrodes 62 in the same row are coupled to one another, and the second touch electrodes 62 in rows, adjacent to each other, of the plurality of rows of second touch electrodes 62 are insulated from each other. For example, in the first direction X, the plurality of second touch electrodes 62 in the same row are coupled to one another, and the plurality of second touch electrodes 62 in different rows are insulated from each other. For example, the second touch electrodes 62 in each row may be used as a second channel for a second touch signal.

In some embodiments, both the first touch electrode 61 and the second touch electrode 62 are of grid-block structures.

The first touch electrode 61 may be a Tx electrode (Transmit, a touch transmitting electrode), and the second touch electrode 62 may be an Rx electrode (Receive, a touch receiving electrode). Alternatively, the first touch electrode 61 may be an Rx electrode, and the second touch electrode 62 may be a Tx electrode, which is not limited in all the embodiments of the disclosure.

With FIG. 15 as an example, in the active area, signal lines electrically connected with the first touch electrodes 61 in the same column are second signal sub-lines, and signal lines electrically connected with the second touch electrode 62 in the same row are first signal sub-lines. In the inactive area, trace lines electrically connected with the first signal sub-lines 31 are first sub-trace lines 21, and trace lines electrically connected with the second signal sub-lines 32 are second sub-trace lines 22.

Figure 16:
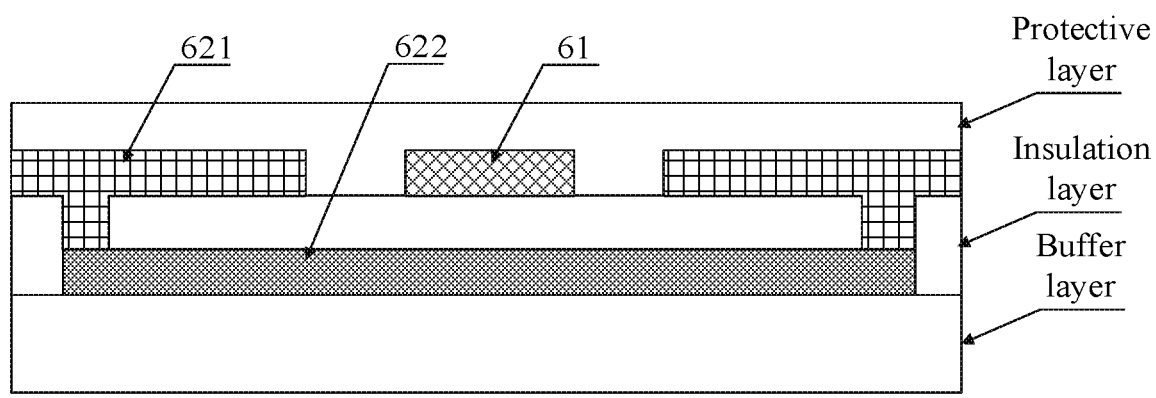
FIG. 16 shows a sectional view of a touch panel according to an embodiment of the disclosure.
Figure 17:
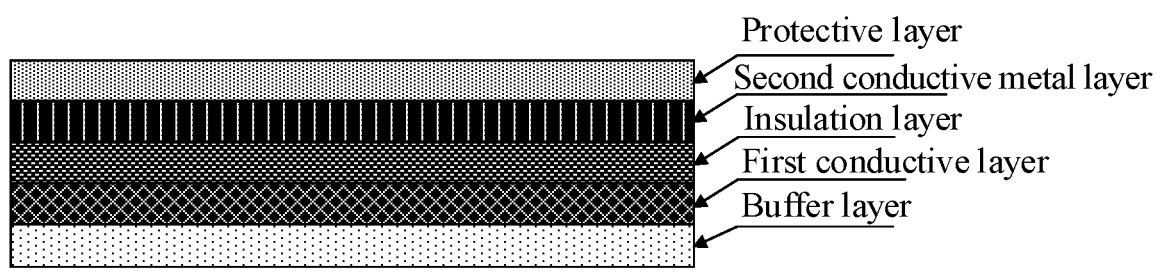
FIG. 17 shows a schematic structural diagram of a flexible multi-layer on cell (FMLOC) film layer according to an embodiment of the disclosure.

FIG. 16 is a sectional view of a touch panel according to an embodiment of the disclosure. FIG. 16 is a sectional view along line II' in FIG. 15. The touch panel is generally formed through a flexible multi-layer on cell (FMLOC) technology, and correspondingly, a film layer of the touch panel may be called an FMLOC film layer. FIG. 17 is a schematic structural diagram of an FMLOC film layer according to an embodiment of the disclosure. The FMLOC film layer includes a buffer layer (Buffer), a first conductive layer (Bridge, also called TMA), a metal layer corresponding to a bridging portion 622, an insulation layer (SiNx), a second conductive layer (a metal mesh, also called TMB), a metal layer corresponding to a touch sub-electrode 621, and a protective layer (OC), where the TMA described above is arranged on the same layer as the bridging portion 622, and the TMB is arranged on the same layer as the touch sub-electrode 621.

The electrical testing signal line 4 may be double-layered. For example, one electrical testing signal line 4 is double-layered by TMA (Ti/Al/Ti) and TMB (Ti/Al/Ti), and portions, in the TMA and the TMB, of the electrical testing signal line 4 are electrically connected through vias.

The electrical testing pin 5 may also be stacked in the TMA and the TMB.

Figure 18:
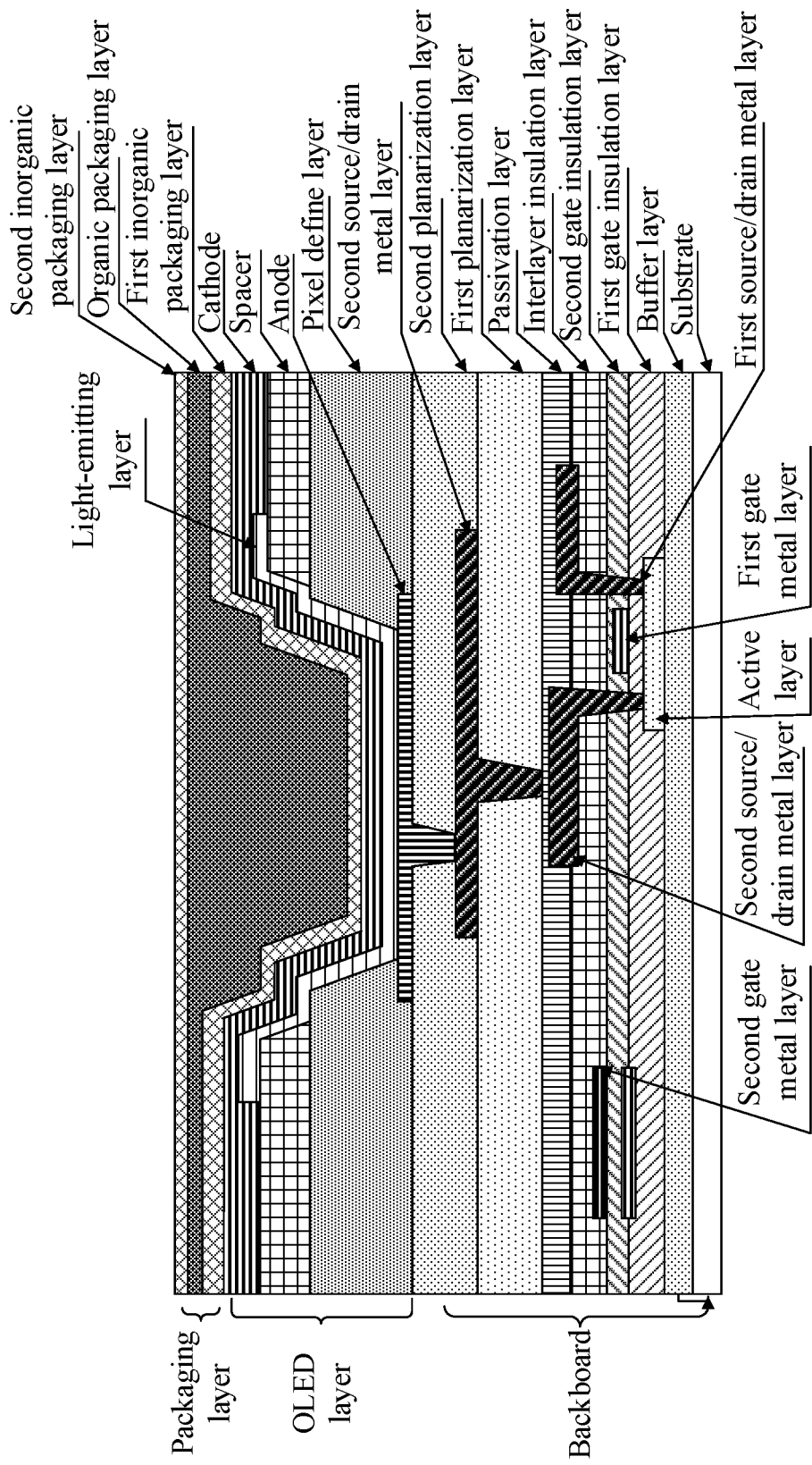
FIG. 18 shows a schematic structural diagram of a display panel according to an embodiment of the disclosure.

FIG. 18 for a schematic structural diagram of a display panel according to an embodiment of the disclosure.

The display panel includes a backboard, an organic light-emitting diode (OLED) layer, and a packaging layer; where the OLED layer includes an anode, a pixel define layer (PDL), a spacer (PS), a light-emitting layer, and a cathode, the packaging layer includes a first inorganic packaging layer, an organic packaging layer, and a second inorganic packaging layer, and the FMLOC film layer described above is stacked on the packaging layer of the display panel.

A backboard metal line is used as an electrical testing signal line 4, thereby saving cost on lines. The electrical testing signal line 4 is double-layered to facilitate flexible wiring, and to save on a space occupied by the electrical testing signal line 4.

Figure 19:
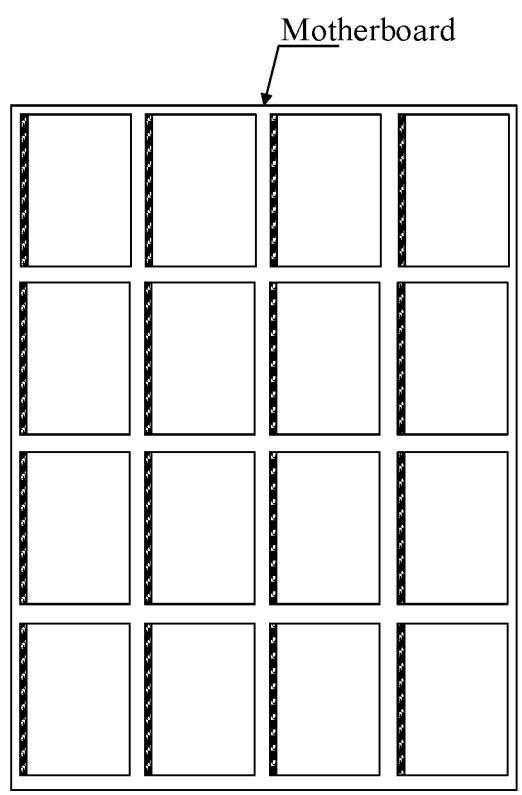
FIG. 19 shows a schematic diagram illustrating another arrangement of panels according to an embodiment of the disclosure.

With reference to FIG. 19, a schematic arrangement diagram of yet another panel according to an embodiment of the disclosure is shown. When the panel shown in FIGS. 8-13 is used, since the electrical testing pin 5 and the bonding pin 1 are designed in a row, each side of the panel only occupies a space of one bonding pin 1 in a length direction even if the lines are led out from the two sides. However, in the related art, when the line is led out from one side, the bonding pin 1 and the electrical testing pin 5 are arranged in the same column (as shown in FIG. 6, a space of two bonding pins 1 in a length direction is occupied). Therefore, even if the lines are led out from the two sides in the disclosure, the electrical testing pin 5 and the bonding pin 1 are arranged in a row, so as to only occupy a space of one bonding pins 1 in the length direction, and the region occupied by the panel in the non-modular state is not enlarged, thereby reducing the loss of an arrangement rate of the panel corresponding to the motherboard according to the embodiment of the disclosure.

Figure 20:
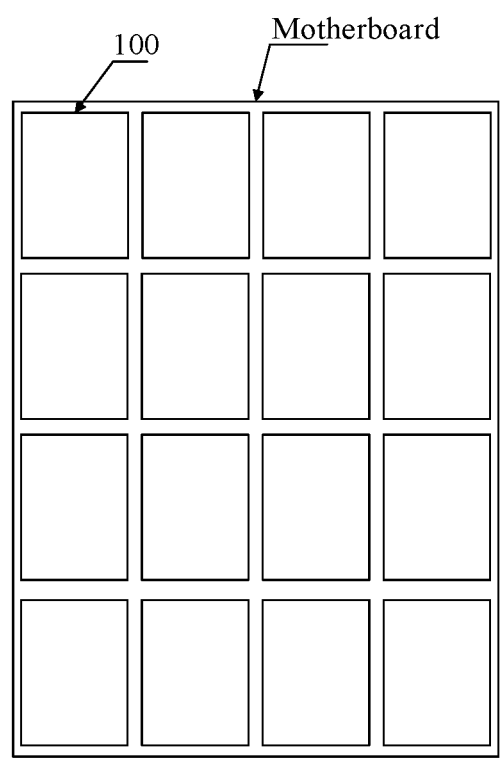
FIG. 20 shows a schematic structural diagram of a motherboard according to an embodiment of the disclosure.

Based on the same inventive concept, an embodiment of the disclosure provides a motherboard. With reference to FIG. 20, a schematic structural diagram of a motherboard according to an embodiment of the disclosure is shown. The motherboard includes:
  a plurality of panel cells 100 in an array, the panel cell 100 including the panel as described above.

Figure 21:
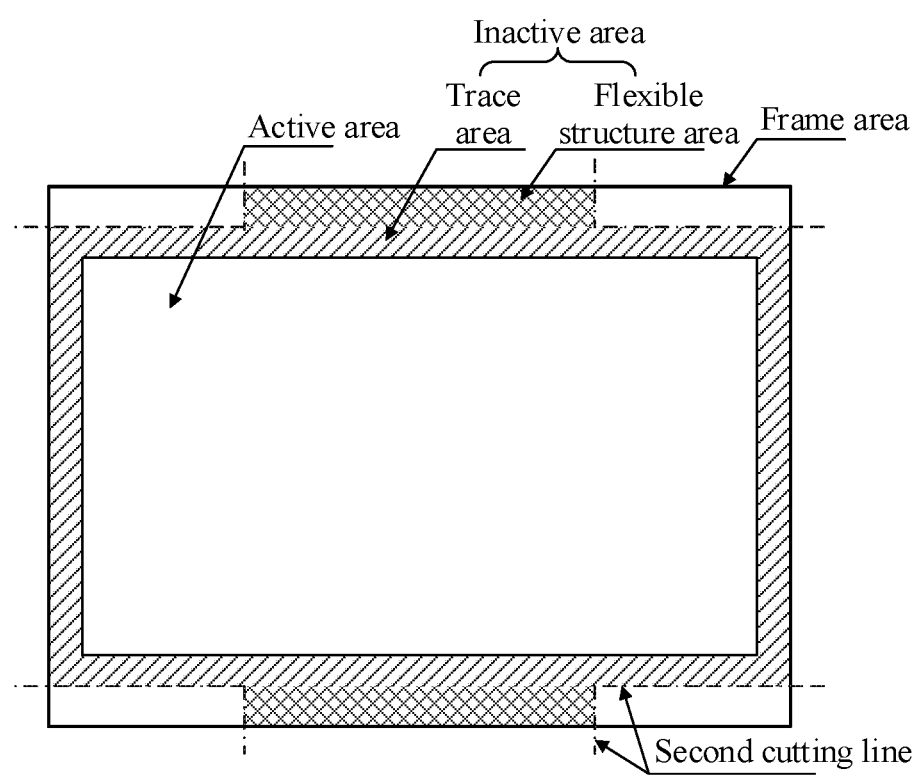
FIG. 21 shows areas of a panel cell according to an embodiment of the disclosure.

With reference to FIG. 21, a schematic regional diagram of a panel cell according to an embodiment of the disclosure is shown.

The panel cell 100 is provided with an active area and a frame area surrounding the active area, the frame area including a trace area surrounding the active area and flexible structure areas extending from portions, on two opposite sides of the active area, of the trace area, and the trace area and the flexible structure areas jointly forming an inactive area of the panel.

A first cutting line for cutting the panel cell being provided at an outer boundary of the frame area (with reference to a boundary line of the frame area).

A second cutting line (figure) for cutting to form the panel being provided at an outer boundary of the inactive area, and the second cutting line being used after the panel cell undergoes an electrical test.

Figure 22:
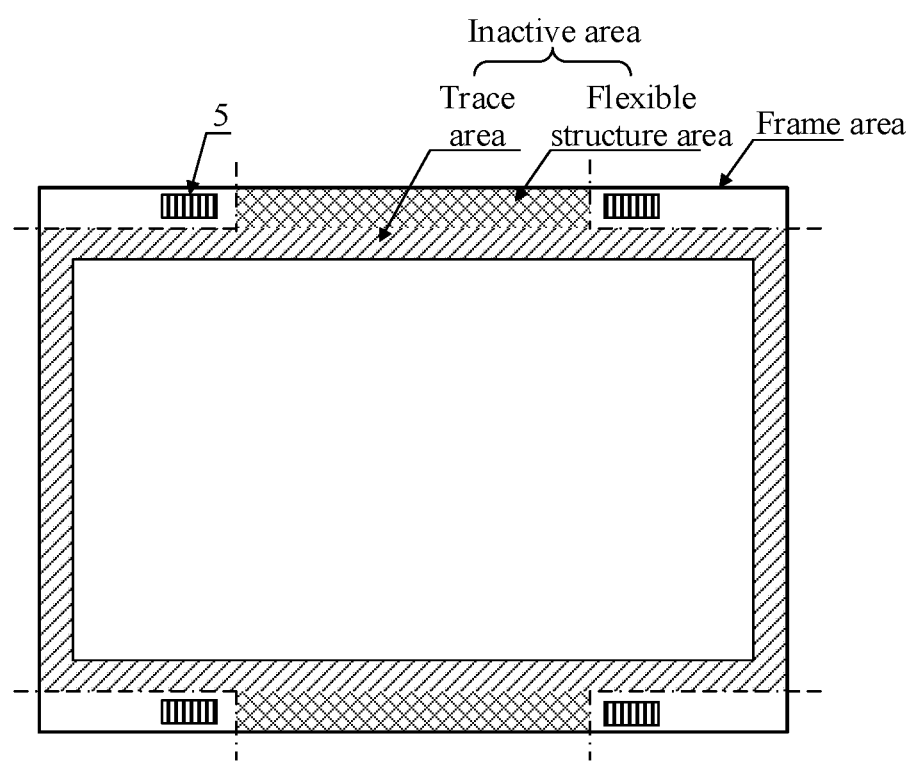
FIGS. 22 and 23 are schematic diagrams of relative positions of an electrical testing pin according to an embodiment of the disclosure.
Figure 23:
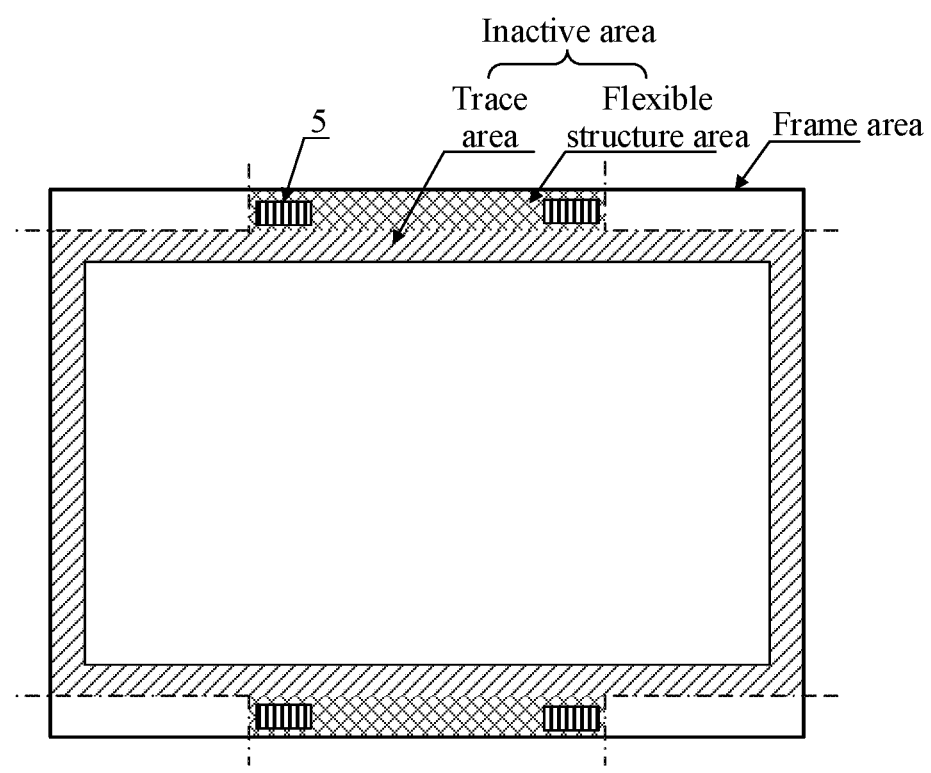

With reference to FIGS. 22 and 23, schematic diagrams of relative positions of an electrical testing pin according to an embodiment of the disclosure are shown. The panel cell 100 further includes:
  at least two groups of electrical testing pins on a side, facing away from the flexible structure area, of the second cutting line or in the flexible structure area, and arranged in same row as corresponding groups of bonding pins in the panel, each electrical testing pin being electrically connected with one bonding pin through one electrical testing signal line in a region between an outer boundary line of the frame area and an outer boundary line of the trace area, and one end, close to the active area, of the electrical testing pin being electrically connected with the electrical testing signal line (as shown in FIGS. 9, 11, and 13).

When not required to be retained on the panel, the electrical testing pin is arranged outside the flexible structure area (as shown in FIG. 21). When required to be retained on the panel, the electrical testing pin is arranged in the flexible structure area (as shown in FIG. 22).

Based on the same inventive concept, an embodiment of the disclosure further provides a display device. The display device includes the panel as described above, the repetitions of which will not be repeated herein. The panel may be at least one of a display panel and a touch panel.

The display device may be a liquid crystal display, a liquid crystal display screen, a liquid crystal television, etc., and may also be a mobile apparatus such as a mobile phone, a tablet computer, a notebook computer, etc.

Although the preferred embodiments of the disclosure have been described, a person skilled in the art can make additional changes and modifications to these embodiments once they know the basic creative concept. Therefore, the appended claims are intended to be interpreted as including the preferred embodiments and all changes and modifications falling within the scope of the disclosure.

Although the preferred embodiments of the disclosure have been described, a person skilled in the art can make additional changes and modifications to these embodiments once they know the basic creative concept. Therefore, the appended claims are intended to be interpreted as including the preferred embodiments and all changes and modifications falling within the scope of the disclosure.

Apparently, a person skilled in the art can make various amendments and variations to the embodiments of the disclosure without departing from the spirit and scope of the embodiments of the disclosure. In this way, the disclosure is also intended to include these modifications and variations to the embodiments of the disclosure if they fall within the scope of the claims of the disclosure and the equivalents thereof.

What is claimed is:

1. A panel, comprising an active area and an inactive area surrounding the active area, wherein the panel comprises:
   a plurality of groups of signal lines in the active area;
   a plurality of groups of bonding pins distributed in portions of the inactive area on two opposite sides of the active area, and different groups of bonding pins on a same side of the active area being arranged in a row; and
   a plurality of groups of trace lines distributed in the inactive area surrounding the active area, an end of the trace line being electrically connected with the signal line, other end of the trace line being electrically connected with the bonding pin, and two ends of a same signal line being electrically connected with two trace lines;
   wherein the plurality of groups of signal lines comprise:
      two groups of first signal sub-lines extending in a first direction, the two groups of first signal sub-lines being symmetrically distributed with respect to a first central line passing through a center of the active area, and an extension direction of the first central line being the first direction; and
   the plurality of groups of trace lines comprise:
      four groups of first sub-trace lines, every two groups of first sub-trace lines being electrically connected with one group of first signal sub-lines, two groups of first sub-trace lines connected with a same group of first signal sub-lines being symmetrical with respect to a second central line passing through the center of the active area, two groups of first sub-trace lines connected with different groups of first signal sub-lines being symmetrical with respect to the first central line, an extension direction of the second central line being a second direction, and the second direction intersecting the first direction.

2. The panel according to claim 1, wherein the plurality of groups of signal lines comprise:
   two groups of second signal sub-lines extending in a second direction, the two groups of second signal sub-lines being symmetrically distributed with respect to a second central line passing through a center of the active area, and an extension direction of the second central line being a second direction; and
   the plurality of groups of trace lines comprise:
   four groups of second sub-trace lines, every two groups of second sub-trace lines being electrically connected with one group of second signal sub-lines, two groups of second sub-trace lines connected with a same group of second signal sub-lines being symmetrical with respect to a first central line passing through the center of the active area, two groups of second sub-trace lines connected with different groups of second signal sub-lines being symmetrical with respect to the second central line, and an extension direction of the first central line intersecting the second direction.

3. The panel according to claim 2, wherein
   the panel is a display panel, the first signal sub-line is a scanning line, and the second signal sub-line is a data line; or
   the panel is a touch panel, the first signal sub-line is a touch sensing line, and the second signal sub-line is a touch driving line.

4. The panel according to claim 1, further comprising a bending area between the bonding pin and the active area, wherein
   the other end of the trace line is electrically connected with the corresponding bonding pin passing through the bending area; and
   the panel further comprises:
   a plurality of electrical testing signal lines electrically connected one-to-one with the bonding pins, the electrical testing signal line being electrically connected with an electrical testing pin, the electrical testing pin being used for performing a flexible multi-layer on cell electrical test on the signal line of the panel being in a non-modular state, wherein the non-modular state is a state before the panel is not bound with a flexible circuit board provided with a driving circuit.

5. The panel according to claim 4, wherein the electrical testing signal line is electrically connected with an end of the bonding pin away from the bending area.

6. The panel according to claim 4, wherein the electrical testing signal line is electrically connected with a corresponding bonding pin through a corresponding trace line.

7. The panel according to claim 6, wherein the electrical testing signal line is electrically connected with the trace line in a region between the bending area and the bonding pin; or
   the electrical testing signal line is electrically connected with the trace line in a region between the active area and the bending area.

8. The panel according to claim 4, wherein one ends of the plurality of electrical testing signal lines away from the bonding pins extend to an edge of the inactive area and are sectioned.

9. The panel according to claim 4, further comprising:
   at least two groups of the electrical testing pins arranged in a same row with corresponding groups of bonding pins, wherein
   each electrical testing pin is electrically connected with a bonding pin through one electrical testing signal line, and an end of the electrical testing pin close to the active area is electrically connected with the electrical testing signal line.

10. The panel according to claim 4, wherein the electrical testing signal line comprises a backboard metal line.

11. The panel according to claim 10, wherein the electrical testing signal line is double layered.

12. A motherboard, comprising:
    a plurality of panel cells in an array, the panel cell comprising a panel,
    wherein the panel comprises an active area and an inactive area surrounding the active area, and comprises:
       a plurality of groups of signal lines in the active area;
       a plurality of groups of bonding pins distributed in portions of the inactive area on two opposite sides of the active area, and different groups of bonding pins on a same side of the active area being arranged in a row; and
       a plurality of groups of trace lines distributed in the inactive area surrounding the active area, an end of the trace line being electrically connected with the signal line, other end of the trace line being electrically connected with the bonding pin, and two ends of a same signal line being electrically connected with two trace lines;
    wherein the panel cell has an active area and a frame area surrounding the active area, the frame area comprises a trace area surrounding the active area and flexible structure areas extending from portions of the trace area on two opposite sides of the active area, and the trace area and the flexible structure areas form the inactive area of the panel;

a first cutting line for cutting the panel cell, at an outer boundary of the frame area; and a second cutting line for cutting to form the panel, at an outer boundary of the inactive area, wherein the second cutting line is used after the panel cell undergoes an electrical test.

13. The motherboard according to claim 12, wherein the panel cell further comprises:

at least two groups of electrical testing pins disposed on a side of the second cutting line facing away from the flexible structure area or disposed in the flexible structure area, and disposed in a same row with corresponding groups of bonding pins in the panel;

wherein each electrical testing pin is electrically connected with a bonding pin through one electrical testing signal line in a region between an outer boundary line of the frame area and an outer boundary line of the trace area; and an end of the electrical testing pin close to the active area is electrically connected with the electrical testing signal line.

14. A display device, comprising:

a panel, wherein the panel comprises an active area and an inactive area surrounding the active area, and comprises:

a plurality of groups of signal lines in the active area;

a plurality of groups of bonding pins distributed in portions of the inactive area on two opposite sides of the active area, and different groups of bonding pins on a same side of the active area being arranged in a row; and a plurality of groups of trace lines distributed in the inactive area surrounding the active area, an end of the trace line being electrically connected with the signal line, other end of the trace line being electrically connected with the bonding pin, and two ends of a same signal line being electrically connected with two trace lines;

wherein the panel is at least one of a display panel and a touch panel;

wherein the plurality of groups of signal lines comprise:

two groups of first signal sub-lines extending in a first direction, the two groups of first signal sub-lines being symmetrically distributed with respect to a first central line passing through a center of the active area, and an extension direction of the first central line being the first direction; and the plurality of groups of trace lines comprise:

four groups of first sub-trace lines, every two groups of first sub-trace lines being electrically connected with one group of first signal sub-lines, two groups of first sub-trace lines connected with a same group of first signal sub-lines being symmetrical with respect to a second central line passing through the center of the active area, two groups of first sub-trace lines connected with different groups of first signal sub-lines being symmetrical with respect to the first central line, an extension direction of the second central line being a second direction, and the second direction intersecting the first direction.

15. The display device according to claim 14, wherein the plurality of groups of signal lines comprise:

two groups of second signal sub-lines extending in a second direction, the two groups of second signal sub-lines being symmetrically distributed with respect to a second central line passing through a center of the active area, and an extension direction of the second central line being a second direction; and the plurality of groups of trace lines comprise:

four groups of second sub-trace lines, every two groups of second sub-trace lines being electrically connected with one group of second signal sub-lines, two groups of second sub-trace lines connected with a same group of second signal sub-lines being symmetrical with respect to a first central line passing through the center of the active area, two groups of second sub-trace lines connected with different groups of second signal sub-lines being symmetrical with respect to the second central line, and an extension direction of the first central line intersecting the second direction.

16. The display device according to claim 14, further comprising a bending area between the bonding pin and the active area, wherein the other end of the trace line is electrically connected with the corresponding bonding pin passing through the bending area; and the panel further comprises:

a plurality of electrical testing signal lines electrically connected one-to-one with the bonding pins, the electrical testing signal line being electrically connected with an electrical testing pin, the electrical testing pin being used for performing a flexible multi-layer on cell electrical test on the signal line of the panel being in a non-modular state, wherein the non-modular state is a state before the panel is not bound with a flexible circuit board provided with a driving circuit.

17. The display device according to claim 16, wherein the electrical testing signal line is electrically connected with an end of the bonding pin away from the bending area.

18. The display device according to claim 16, wherein the electrical testing signal line is electrically connected with a corresponding bonding pin through a corresponding trace line.

* * * * *